(12) United States Patent
Hamamoto et al.

(10) Patent No.: US 8,400,835 B2
(45) Date of Patent: Mar. 19, 2013

(54) NON-VOLATILE SEMICONDUCTOR MEMORY

(75) Inventors: Yukimasa Hamamoto, Kyoto (JP); Masahiro Toki, Shiga (JP)

(73) Assignee: Panasonic Corporation, Osaka (JP)

( * ) Notice: Subject to any disclaimer, the term of this patent is extended or adjusted under 35 U.S.C. 154(b) by 107 days.

(21) Appl. No.: 13/190,130

(22) Filed: Jul. 25, 2011

(65) Prior Publication Data

US 2011/0280081 A1    Nov. 17, 2011

Related U.S. Application Data

(63) Continuation of application No. PCT/JP2009/004737, filed on Sep. 18, 2009.

(30) Foreign Application Priority Data

Feb. 6, 2009    (JP) ................................. 2009-026211

(51) Int. Cl.
*G11C 16/10*    (2006.01)
(52) U.S. Cl. ......... 365/185.18; 365/185.23; 365/189.09; 365/230.06
(58) Field of Classification Search .................... None
See application file for complete search history.

(56) References Cited

U.S. PATENT DOCUMENTS

| 8,085,609 | B2 * | 12/2011 | Shinoda ........................ 365/201 |
|---|---|---|---|
| 2003/0063494 | A1 | 4/2003 | Kurosaki |
| 2003/0218897 | A1 | 11/2003 | Kato et al. |
| 2004/0100825 | A1 | 5/2004 | Takahashi |
| 2004/0174745 | A1 | 9/2004 | Ryoo |

FOREIGN PATENT DOCUMENTS

| JP | 05-062484 | 3/1993 |
|---|---|---|
| JP | 06-150670 | 5/1994 |
| JP | 2003-109389 | 4/2003 |
| JP | 2003-346484 | 12/2003 |
| JP | 2004-220728 | 8/2004 |
| JP | 2004-273096 | 9/2004 |
| WO | WO 02/097821 | 12/2002 |

* cited by examiner

*Primary Examiner* — Tan T. Nguyen
(74) *Attorney, Agent, or Firm* — McDermott Will & Emery LLP

(57) ABSTRACT

When a plurality of non-volatile memory cells in a memory cell array are simultaneously written, bit lines of the plurality of non-volatile memory cells are connected to M data lines, where M is an integer of two or more, based on a column address signal. N switches, where N is an integer of one or more, and a switch control circuit for controlling the N switches, are provided for each data line. The M switch control circuits control the M×N switches to change the levels or apply periods of drain voltages applied to the bit lines of the plurality of memory cells on a memory cell-by-memory cell basis.

8 Claims, 7 Drawing Sheets

| DIN | SWIN1 | SWIN2 | SWOUT1 | SWOUT2 | ON-STATE TRANSISTOR |
|---|---|---|---|---|---|
| L | — | — | H | H | NONE |
| H | L | L | H | H | NONE |
| H | H | L | L | H | P 1 |
| H | L | H | H | L | P 2 |
| H | H | H | L | L | P 1, P 2 |

| DIN | SWIN | SWOUT1 | SWOUT2 | ON-STATE TRANSISTOR |
|---|---|---|---|---|
| L | — | H | L | NONE |
| H | L | L | L | P 1 |
| H | H | H | H | N 1 |

NON-VOLATILE SEMICONDUCTOR MEMORY

CROSS-REFERENCE TO RELATED APPLICATIONS

This is a continuation of PCT International Application PCT/JP2009/004737 filed on Sep. 18, 2009, which claims priority to Japanese Patent Application No. 2009-026211 filed on Feb. 6, 2009. The disclosures of these applications including the specifications, the drawings, and the claims are hereby incorporated by reference in their entirety.

BACKGROUND

The present disclosure relates to non-volatile semiconductor memories, and more particularly, techniques of reducing variations in write speed when a plurality of non-volatile memory cells are simultaneously written to the same threshold level.

A non-volatile semiconductor memory, such as a flash memory etc., typically includes a memory cell array including a plurality of memory cells arranged in a matrix, where each memory cell includes a gate electrode connected to a word line, a drain connected to a bit line, a source connected to a source line, and a floating gate or a charge trapping layer.

For example, in a non-volatile semiconductor memory including a trapping layer, charge (electrons or holes) are injected into and trapped by discrete patches of a trapping layer (a SiN film or a transition region at an interface between a SiN film and a top $SiO_2$ film) which are located in an insulating film ($SiO_2$) between the channel region and gate electrode of a memory cell. The value of information (data) stored in the memory cell is determined to be "0" or "1" based on the threshold level of the memory cell. The injection of electrons is assumed to mean write operation. The principle of the write operation will be described hereinafter.

FIG. 9 shows a memory cell in a conventional non-volatile semiconductor memory. The memory cell includes a semiconductor substrate 600 made of P-type silicon, a P-type channel region 601 provided on the semiconductor substrate 600, a first impurity region 602 (e.g., a drain) made of an N-type semiconductor provided on the semiconductor substrate 600 on one side of the channel region 601, a second impurity region 603 (e.g., a source) made of an N-type semiconductor provided on the semiconductor substrate 600 on the other side of the channel region 601, a bottom insulating film 604 made of a silicon oxide film provided on the semiconductor substrate 600, a trapping layer 605 made of a silicon oxynitride film provided on the bottom insulating film 604, a top insulating film 606 made of a silicon oxide film provided on the trapping layer 605, and a gate electrode 607 made of N-type polysilicon provided on the top insulating film 606.

During write operation, a voltage of about 9 V is applied to the gate electrode 607, a voltage of about 5 V is applied to the first impurity region (drain) 602, a voltage of 0 V is applied to the second impurity region (source) 603, and a voltage of 0 V is applied to the semiconductor substrate 600. As a result, a portion of electrons traveling from the second impurity region 603 toward the first impurity region 602 become hot by a high electric field in the vicinity of the first impurity region 602, and are locally injected into the trapping layer 605 in the vicinity of the first impurity region 602, so that the threshold level of the memory cell is increased.

The write operation of the non-volatile semiconductor memory is typically performed on a group of memory cells basis, such as on a byte-by-byte basis, on a word-by-word basis, etc. The write voltage is simultaneously applied to memory cells in the group, whereby the write time is reduced.

In the non-volatile semiconductor memory including the trapping layer, if voltages applied to the first impurity region 602 and the second impurity region 603 of the memory cell are switched, i.e., a voltage of 0 V is applied to the first impurity region 602 and a voltage of about 5 V is applied to the second impurity region 603, whereby electrons are also locally injected into the trapping layer 605 in the vicinity of the second impurity region 603. As a result, the memory cell can store two bits of data.

In recent years, however, as the capacity of non-volatile semiconductor memories has increased, the area of the memory cell array has also increased, and therefore, the length of bit lines provided in the memory cell array has also increased. Therefore, in write operation, the drain voltage varies depending on the position of the memory cell in the memory cell array because of a voltage drop caused by the resistance of the bit line, resulting in variations in write speed.

In addition, in the non-volatile semiconductor memory which includes the trapping layer and can store two bits of data in each memory cell, it is known that the memory state of a first bit has an influence on the write speed of a second bit, leading to variations in write speed.

To address these problems, there is a conventional technique of reducing variations in write speed by changing the level of a bit line voltage supplied to a bit line in a memory cell array, depending on a write address, during write operation (see Japanese Patent Publication No. 2003-109389).

In the conventional technique, however, a plurality of memory cells are simultaneously written under write conditions (a drain voltage and a drain voltage supply period) which are common to the memory cells. Therefore, variations in write speed between the memory cells which are simultaneously written cannot be reduced, leading to a degradation in the reliability of the memory cells. Moreover, because the write time depends on a memory cell having a low write speed, the write time increases due to variations in write speed.

SUMMARY

According to the present disclosure, when a plurality of non-volatile memory cells are simultaneously written, bit lines of the plurality of non-volatile memory cells are connected to M data lines, where M is an integer of two or more, based on a column address signal. In addition, N switches, where N is an integer of one or more, and a switch control circuit for controlling the N switches, are provided for each data line. The M switch control circuits control the M×N switches to change the levels or apply periods of drain voltages applied to the bit lines of the plurality of memory cells on a memory cell-by-memory cell basis.

In the non-volatile semiconductor memory of the present disclosure, variations in write speed between each memory cell which occur when a plurality of non-volatile memory cells are simultaneously written, are reduced or prevented, whereby variations in threshold level after write operation can be reduced to improve the reliability of the memory cell, and an increase in write time caused by the variations in write speed can be reduced or prevented.

DETAILED DESCRIPTION

Embodiments of the present disclosure in which a plurality of non-volatile memory cells are simultaneously written will be described hereinafter with reference to the accompanying drawings.

Figure 1:
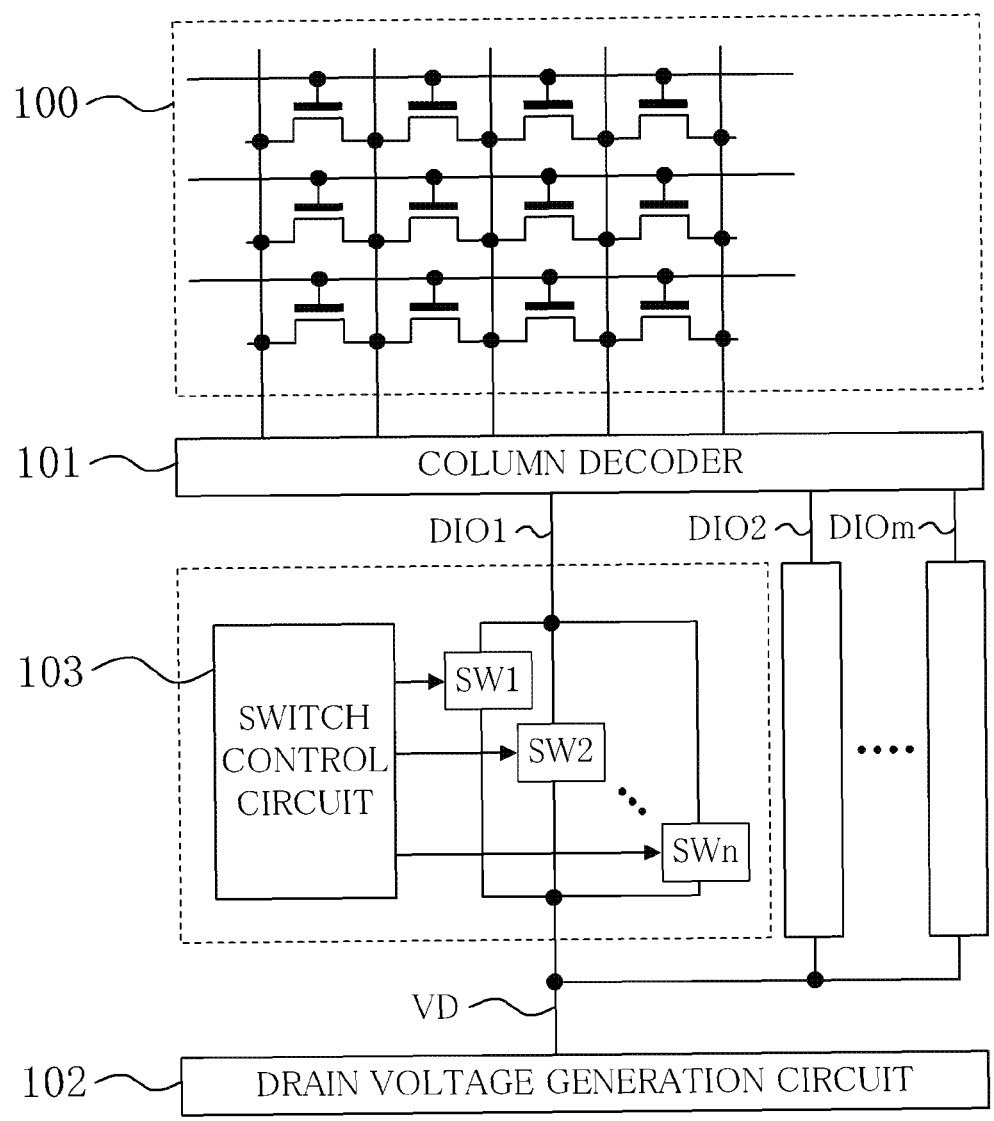
FIG. 1 is a block diagram showing a first example configuration of a non-volatile semiconductor memory according to the present disclosure.

FIG. 1 shows an example configuration of a non-volatile semiconductor memory according to the present disclosure. The non-volatile semiconductor memory includes a memory cell array 100 including a plurality of memory cells, a column decoder 101 which connects a plurality of bit lines and M data lines DIO1-DIOm together using a column address signal, where M is an integer which is smaller than the number of the bit lines, and a drain voltage generation circuit 102 which supplies a drain voltage to the bit lines.

N switches SW1-SWn each having a first and a second terminal are provided for each data line. The first terminals of the N switches SW1-SWn for each data line are connected at a common point to the data line. The second terminals of the N switches SW1-SWn for each data line are connected at a common point to a drain voltage supply line VD which is an output of the drain voltage generation circuit 102. A switch control circuit 103 which controls each of the N switches SW1-SWn is provided for each data line.

The M switch control circuits 103 control the M×N switches so that the levels and supply periods of drain voltages supplied to the M data lines DIO1-DIOm can be changed on a data line-by-data line basis. As a result, the write speeds of memory cells connected to the M data lines DIO1-DIOm can be changed on a memory cell-by-memory cell basis, whereby variations in write speed which occur when a plurality of memory cells are simultaneously written can be reduced or prevented.

Figures 2, 3:
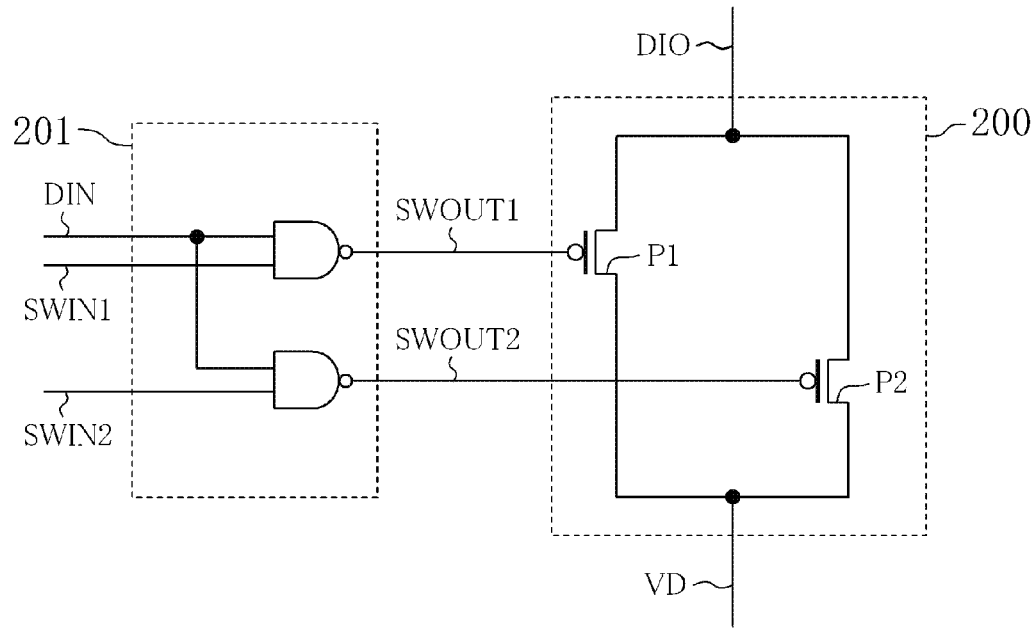
FIG. 2 is a diagram showing a first example configuration of a switch circuit and a switch control circuit according to the present disclosure.
FIG. 3 is a diagram for describing a switch control method in the first example configuration of the switch circuit and the switch control circuit of the present disclosure.

FIG. 2 shows a first example configuration of a switch circuit and a switch control circuit which changes the voltage level of a drain voltage supplied to a data line. The switch circuit 200 includes two P-type transistors P1 and P2 each having a first and a second terminal. The first terminals of the P-type transistors P1 and P2 are connected at a common point to the data line DIO, and the second terminals of the P-type transistors P1 and P2 are connected at a common point to the drain voltage supply line VD. The switch control circuit 201 receives a data input signal DIN and switch control input signals SWIN1 and SWIN2, and outputs switch control output signals SWOUT1 and SWOUT2. The switch control output signals SWOUT1 and SWOUT2 are connected to gate terminals of the P-type transistor P1 and P2, respectively, of the switch circuit 200.

FIG. 3 shows a relationship between the data input signal DIN, the switch control input signals SWIN1 and SWIN2, and the switch control output signals SWOUT1 and SWOUT2 in the switch control circuit 201. In FIG. 3, "L" represents 0 V, and "H" represents the same level as that of the drain voltage supply line VD. When SWOUT1 is "L," the P-type transistor P1 of the switch circuit 200 is turned on. When SWOUT2 is "L," the P-type transistor P2 of the switch circuit 200 is turned on. By changing combinations of on and off states of the P-type transistors P1 and P2 of the switch circuit 200, the transistor resistance between the data line DIO and the drain voltage supply line VD can be changed, so that the magnitude of a voltage drop by the transistor resistance can be changed. Thus, the level of a voltage supplied to the data line DIO can be changed by changing combinations of on and off states of the P-type transistors P1 and P2 of the switch circuit 200.

Figures 4, 5:
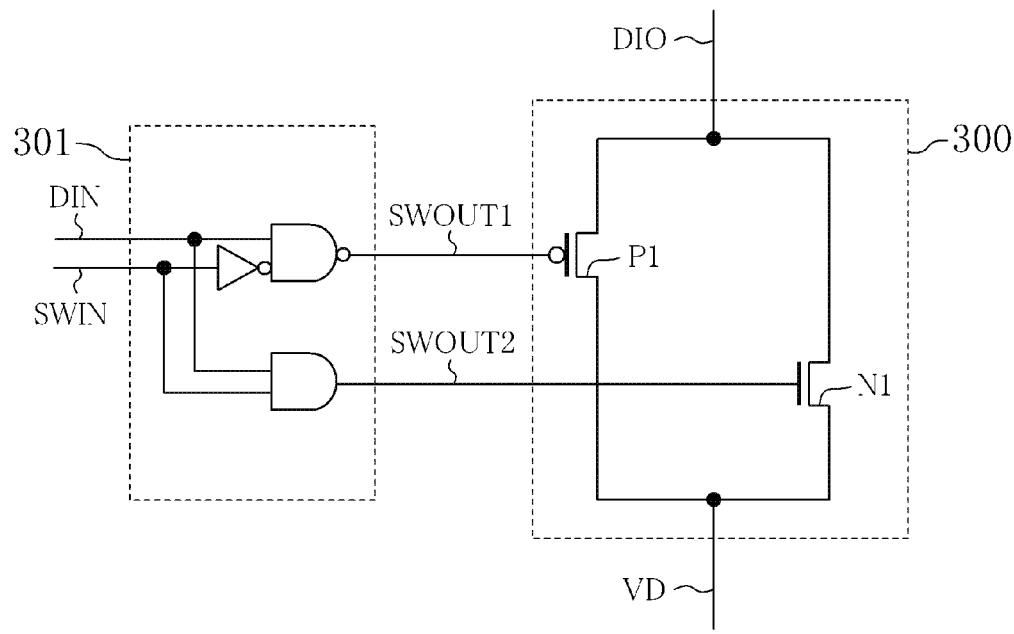
FIG. 4 is a diagram showing a second example configuration of a switch circuit and a switch control circuit according to the present disclosure.
FIG. 5 is a diagram for describing a switch control method in the second example configuration of the switch circuit and the switch control circuit of the present disclosure.

FIG. 4 shows a second example configuration of a switch circuit and a switch control circuit which changes the voltage level of a drain voltage supplied to a data line. The switch circuit 300 includes a P-type transistor P1 and an N-type transistor N1 each having a first and a second terminal. The first terminals of the P-type transistor P1 and the N-type transistor N1 are connected at a common point to the data line DIO, and the second terminals of the P-type transistor P1 and the N-type transistor N1 are connected at a common point to the drain voltage supply line VD. The switch control circuit 301 receives a data input signal DIN and a switch control input signal SWIN, and outputs switch control output signals SWOUT1 and SWOUT2. The switch control output signals SWOUT1 and SWOUT2 are connected to gate terminals of the P-type transistor P1 and the N-type transistor N1, respectively, of the switch circuit 300.

FIG. 5 shows a relationship between the data input signal DIN, the switch control input signal SWIN, and the switch control output signals SWOUT1 and SWOUT2 in the switch control circuit 301. In FIG. 5, "L" represents 0 V, and "H" represents the same level as that of the drain voltage supply line VD. When SWOUT1 is "L," the P-type transistor P1 is turned on. When SWOUT2 is "H," the N-type transistor N1 is turned on. When the P-type transistor P1 is on, the level of the drain voltage supply line VD is directly supplied to the data line DIO. On the other hand, when the N-type transistor N1 is on, a level which is lower than the gate voltage of the N-type transistor N1 (here, the level of the drain voltage supply line VD) by the threshold voltage Vtn of the N-type transistor N1. Thus, the level of a voltage supplied to the data line DIO can be changed by selectively turning on only one of the P-type transistor P1 and the N-type transistor N1.

Figure 6:
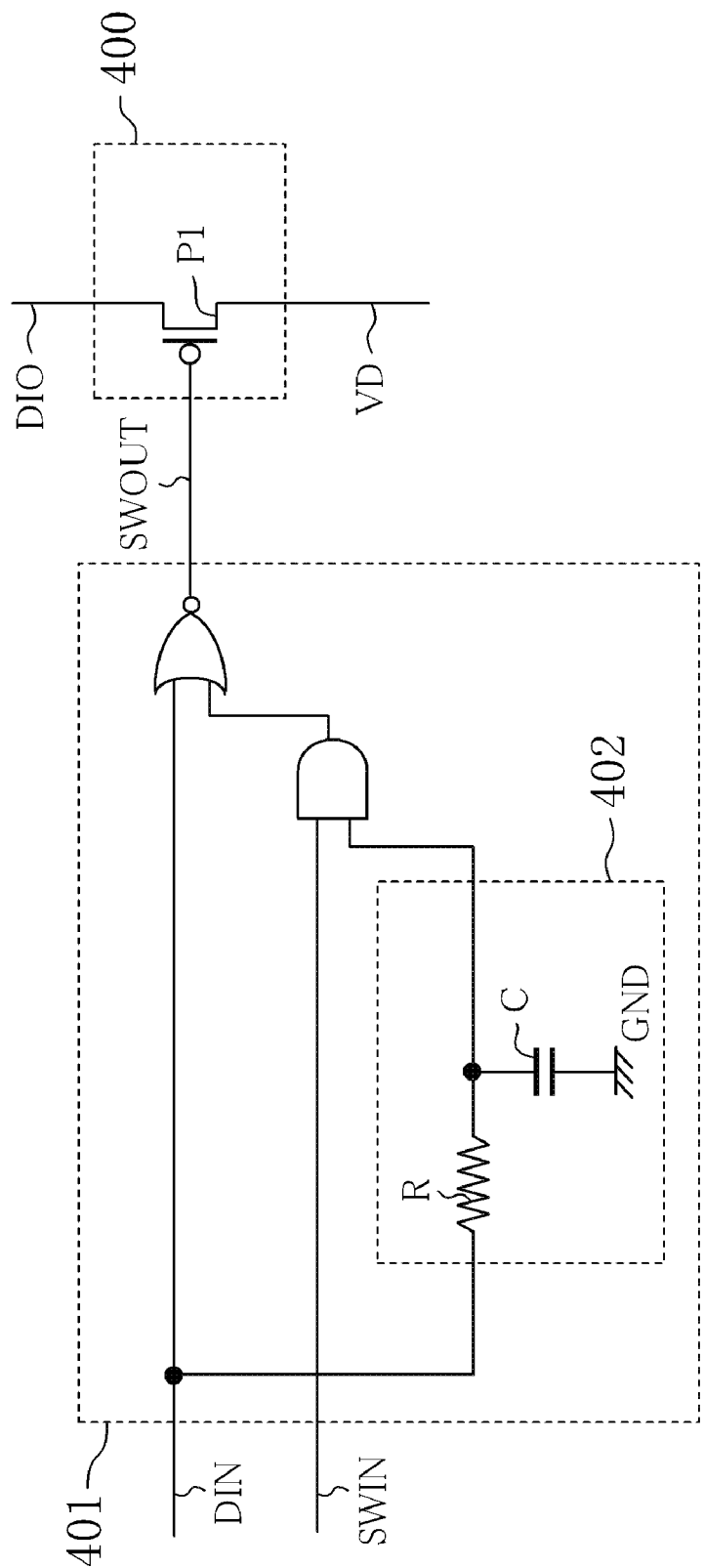
FIG. 6 is a diagram showing a third example configuration of a switch circuit and a switch control circuit according to the present disclosure.

FIG. 6 shows an example configuration of a switch circuit and a switch control circuit which changes the supply period of a drain voltage supplied to a data line. The switch circuit 400 includes a P-type transistor P1 having a first terminal connected to the data line DIO and a second terminal connected to the drain voltage supply line VD. The switch control circuit 401 receives a data input signal DIN and a switch control input signal SWIN, and outputs a switch control output signal SWOUT. The switch control output signal SWOUT is connected to a gate terminal of the P-type transistor P1 of the switch circuit 400. The switch control circuit 401 includes a delay circuit 402 including a resistor R and a capacitor C. An end of the capacitor C is connected to a ground potential GND. The switch control circuit 401 switches "L" periods of the switch control output signal SWOUT based on the switch control input signal SWIN.

Figure 7:
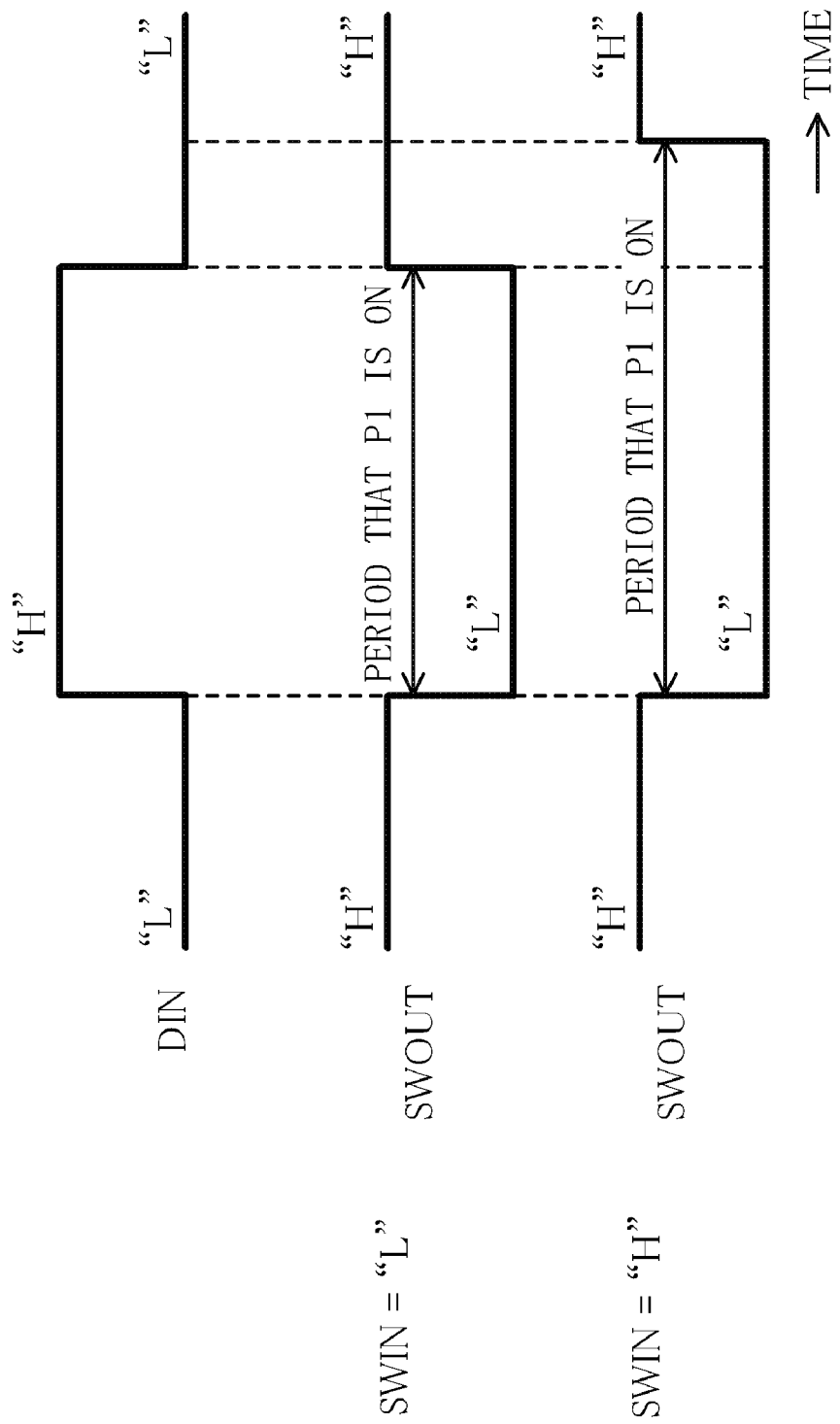
FIG. 7 is a diagram for describing a switch control method in the third example configuration of the switch circuit and the switch control circuit of the present disclosure.

FIG. 7 shows a relationship between the data input signal DIN, the switch control input signal SWIN, and the switch control output signal SWOUT in the switch control circuit 401. In FIG. 7, "L" represents 0 V, and "H" represents the same level as that of the drain voltage supply line VD. During a period in which the switch control output signal SWOUT is "L," the P-type transistor P1 is on, so that the drain voltage is supplied to the data line DIO. Thus, by using the switch control input signal SWIN, the supply period of a voltage supplied to the data line DIO can be changed.

Figure 8:
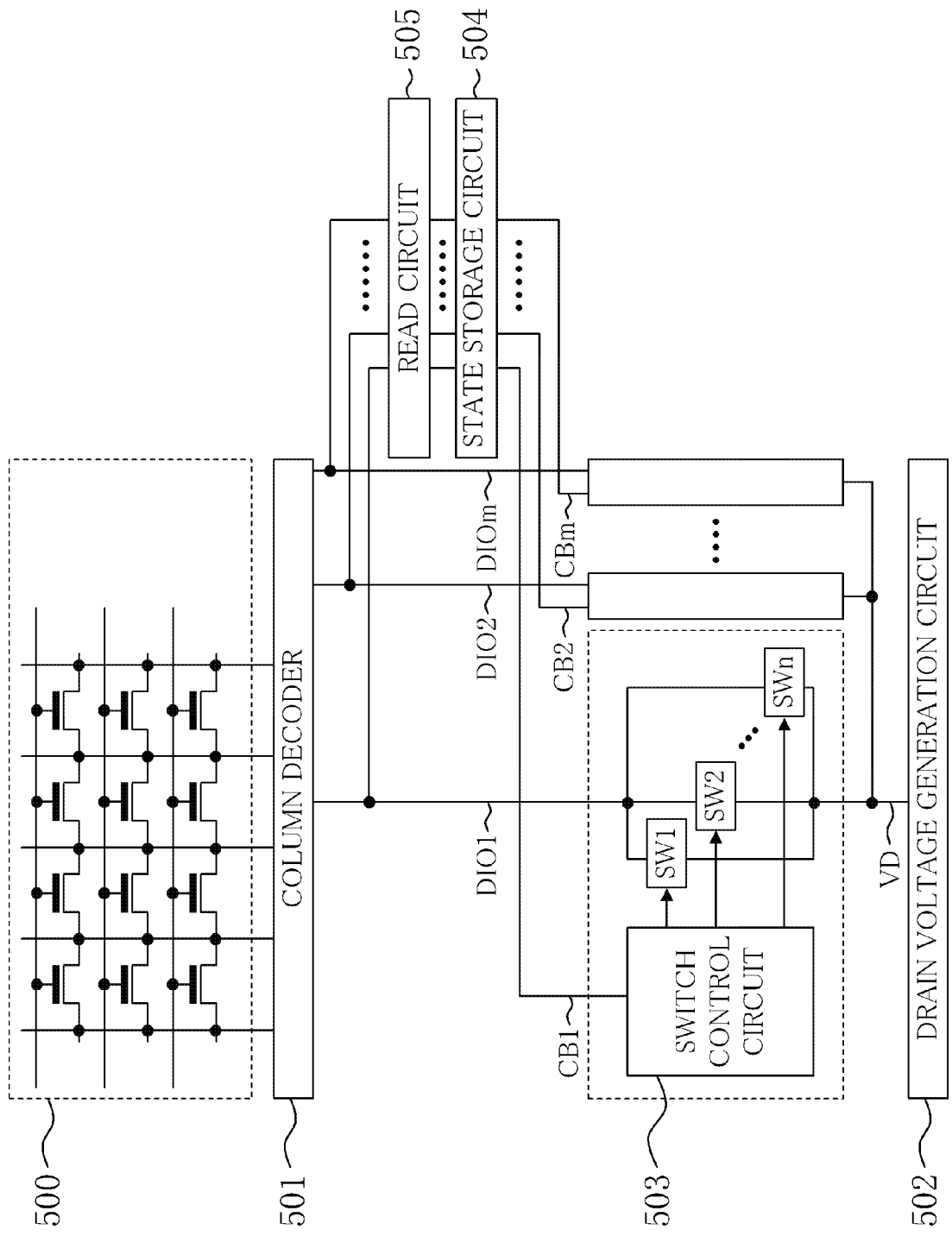
FIG. 8 is a block diagram showing a second example configuration of a non-volatile semiconductor memory according to the present disclosure.
Figure 9:
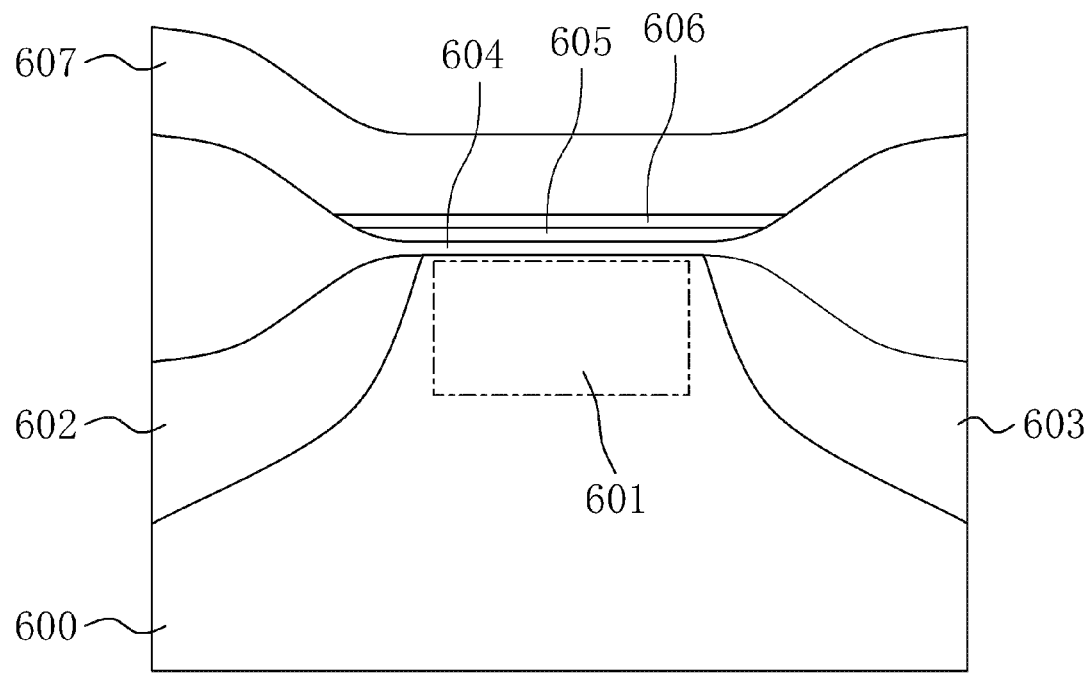
FIG. 9 is a cross-sectional view showing a memory cell structure of a conventional non-volatile semiconductor memory.

FIG. 8 shows another example configuration of the non-volatile semiconductor memory of the present disclosure. The non-volatile semiconductor memory includes a memory cell array 500 including a plurality of memory cells, a column decoder 501 which connects a plurality of bit lines and M data lines DIO1-DIOm together using a column address signal, where M is an integer which is smaller than the number of the bit lines, a read circuit 505 which reads data from the memory cell array 500, and a drain voltage generation circuit 502 which supplies a drain voltage to the bit lines. The read circuit 505 receives the M data lines DIO1-DIOm, and includes a sense amplifier etc. (not shown). The memory cell array 500 includes memory cells including the trapping layer of FIG. 9. Each memory cell can store two bits of data.

N switches SW1-SWn each having a first and a second terminal are provided for each data line. The first terminals of the N switches SW1-SWn for each data line are connected at a common point to the data line. The second terminals of the N switches SW1-SWn for each data line are connected at a common point to a drain voltage supply line VD which is an output of the drain voltage generation circuit 502. A switch control circuit 503 which controls each of the N switches SW1-SWn is provided for each data line.

A state storage circuit 504 is also provided which stores memory states ("0" or "1") of memory cells which have been read out by the read circuit 505. The state storage circuit 504 outputs state output signals CB1-CBm corresponding to the stored memory states of the memory cells. The state output signals CB1-CBm are connected to the M switch control circuits 503.

Before first bits of memory cells connected to the M data lines DIO1-DIOm are written, the memory states of second bits of the memory cells are previously read out by the read circuit 505 and are then stored into the state storage circuit 504. When the first bits of the memory cells are written, the state storage circuit 504 outputs the state output signals CB1-CBm corresponding to the stored memory states, so that the levels and supply periods of voltages supplied to the M data lines DIO1-DIOm can be changed on a data line-by-data line basis based on the state output signals CB1-CBm. Thus, the write speeds of the first bits of the memory cells connected to the M data lines DIO1-DIOm can be changed on a memory cell-by-memory cell basis, depending on the memory states of the second bits of the memory cells, whereby variations in write speed which occur when a plurality of memory cells are written can be reduced or prevented.

A variation of the example configuration of FIG. 8 will be described. Before memory cells connected to the M data lines DIO1-DIOm are written, the threshold levels of the memory cells are previously read out by the read circuit 505 and are then stored into the state storage circuit 504. When the memory cells are written, the state storage circuit 504 outputs the state output signals CB1-CBm corresponding to the threshold levels, so that the levels and supply periods of voltages supplied to the M data lines DIO1-DIOm can be changed on a data line-by-data line basis based on the state output signals CB1-CBm. As a result, the write speeds of the memory cells connected to the M data lines DIO1-DIOm can be changed on a memory cell-by-memory cell basis, depending on the threshold levels of the memory cells, whereby variations in write speed which occur when a plurality of memory cells are written can be reduced.

While, in the above embodiments, one or two switches are connected to each data line, the present disclosure is not limited to this. Alternatively, three or more switches may be connected to each data line. Also, in the non-volatile semiconductor memory having the trapping layer, it is assumed above that each memory cell can store two bits of data. Alternatively, the present disclosure is applicable to a case where each memory cell can store three or more bits of data if the memory cell can be written by changing the voltage relationship between the first and second impurity regions of the memory cell.

As described above, in the non-volatile semiconductor memory of the present disclosure, variations in write speed between each memory cell can be reduced or prevented, whereby the reliability of memory cells can be improved, and an increase in write time caused by variations in write speed can be reduced or prevented. The present disclosure is particularly useful for non-volatile semiconductor memories which include a trapping layer and in which each memory cell can store a plurality of bits of data.

What is claimed is:

1. A non-volatile semiconductor memory in which a plurality of non-volatile memory cells can be simultaneously written using a plurality of bit lines, the device comprising:
    M data lines connected to the plurality of bit lines based on a column address signal, where M is an integer of two or more and is smaller than the number of the bit lines;
    a drain voltage generation circuit configured to generate a voltage which is a source of a drain voltage of each of the plurality of non-volatile memory cells;
    a drain voltage supply line connected to an output of the drain voltage generation circuit; and
    M switch circuits and M switch control circuits provided between the M data lines and the drain voltage supply line,
wherein
    each of the M switch circuits includes N switches, where N is an integer of one or more,
    each of the M×N switches includes a first and a second terminal, and the first terminals of the N switches of each of the M switch circuits are connected at a common point to a corresponding one of the M data lines, and the second terminals of the N switches of each of the M switch circuits are connected at a common point to the drain voltage supply line, and
    the drain voltage supply line is connected to the M data lines via the M×N switches, and the M×N switches are controlled by the M switch control circuits.

2. The non-volatile semiconductor memory of claim 1, wherein
    the N switches of each of the M switch circuits each include a transistor of a first conductivity type, the N transistors being connected together in parallel, and
    when the drain voltage is applied to one of the M data lines, at least one of the N transistors of a corresponding one of the M switch circuits is turned on by a corresponding one of the M switch control circuits.

3. The non-volatile semiconductor memory of claim 1, wherein
the N switches of each of the M switch circuits include a P-type transistor and an N-type transistor connected together in parallel, and
when the drain voltage is applied to one of the M data lines, one of the P-type and N-type transistors of a corresponding one of the M switch circuits is turned on by a corresponding one of the M switch control circuits.

4. The non-volatile semiconductor memory of claim 1, wherein
the M switch control circuits control combination of on and off states of the N switches connected to a corresponding one of the M data lines on a data line-by-data line basis.

5. The non-volatile semiconductor memory of claim 1, wherein
the M switch control circuits control on-state periods of the N switches connected to a corresponding one of the M data lines on a data line-by-data line basis.

6. The non-volatile semiconductor memory of claim 1, further comprising:
a read circuit configured to receive the M data lines; and
a state storage circuit configured to receive M read signals output from the read circuit,
wherein
the M switch circuits are controlled based on M state output signals output from the state storage circuit.

7. The non-volatile semiconductor memory of claim 6, wherein
the plurality of non-volatile memory cells can each store a plurality of bits of data, where the data can be written by reversing a relationship between a source voltage and a drain voltage thereof,
when a first bit is written by application of a source-drain voltage in a first direction, a memory state of a second bit to be written is read out by application of a source-drain voltage in a second direction opposite to the first direction, and the read memory state is stored in the state storage circuit, and
a manner in which the M switch control circuits are controlled is changed based on the memory state stored in the state storage circuit.

8. The non-volatile semiconductor memory of claim 6, wherein
when the plurality of non-volatile memory cells are written, a threshold level state of a memory cell to be written is read out, and the read threshold level state is stored in the state storage circuit, and
a manner in which the M switch control circuits are controlled is changed based on the threshold level state stored in the state storage circuit.

* * * * *